United States Patent [19]
Lee

[11] Patent Number: 5,620,913
[45] Date of Patent: Apr. 15, 1997

[54] METHOD OF MAKING A FLASH MEMORY CELL

[75] Inventor: Hsiao-Lun Lee, Singapore, Singapore

[73] Assignee: Chartered Semiconductor Manufacturing Pte Ltd., Singapore, Singapore

[21] Appl. No.: 654,517

[22] Filed: May 28, 1996

[51] Int. Cl.$^6$ .......................... H01L 21/265; H01L 21/70; H01L 27/00
[52] U.S. Cl. ............................................. 438/264; 438/594
[58] Field of Search ................................ 437/43, 52, 979; 257/314, 315, 316, 317, 318, 319, 320, 321, 322, 323, 324, 325, 326

[56] References Cited

U.S. PATENT DOCUMENTS

| | | | |
|---|---|---|---|
| 4,295,265 | 10/1981 | Horiuchi et al. | 257/316 |
| 4,611,308 | 9/1986 | Lonky | 257/316 |
| 5,444,279 | 8/1995 | Lee | 257/316 |
| 5,482,879 | 1/1996 | Hong | 437/43 |

Primary Examiner—John Niebling
Assistant Examiner—Brian K. Dutton
Attorney, Agent, or Firm—George O. Saile; Graham S. Jones, II

[57] ABSTRACT

A flash memory EEPROM transistor is formed on a surface of a semiconductor substrate. In portions of the substrate, at the surface thereof, a doped source region and a doped drain region are formed with a channel region therebetween. A tunnel silicon oxide dielectric layer is formed over the semiconductor substrate aside from the source region. Above the source region is formed a gate oxide layer which is thicker than the tunnel oxide layer. Above a portion of the tunnel oxide dielectric layer, over the channel region and above a portion of the gate oxide layer is formed a stacked-gate structure for the transistor comprising a floating gate layer, an interelectrode dielectric layer, and a control gate layer. The source region is located on one side of the stacked gate structure with one edge of the source region overlapping the gate structure. The drain region which is located on the other side of the stacked gate structure with one edge thereof overlapping the gate structure.

16 Claims, 4 Drawing Sheets

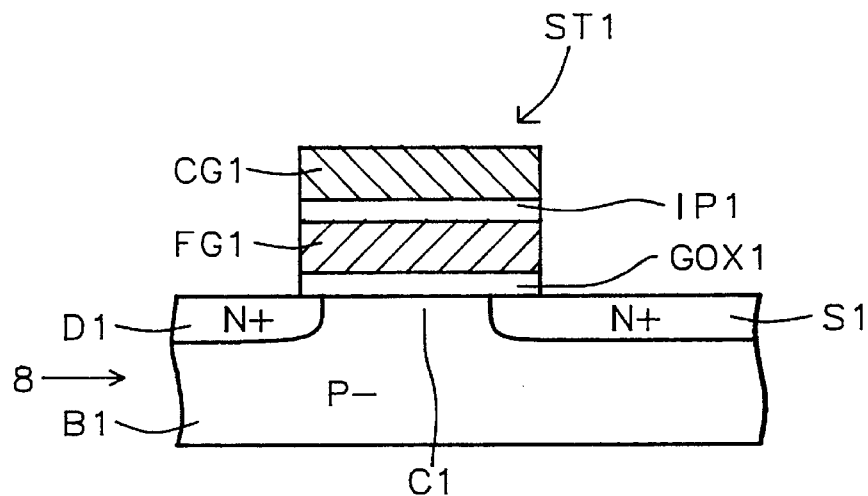
FIG. 1 - Prior Art
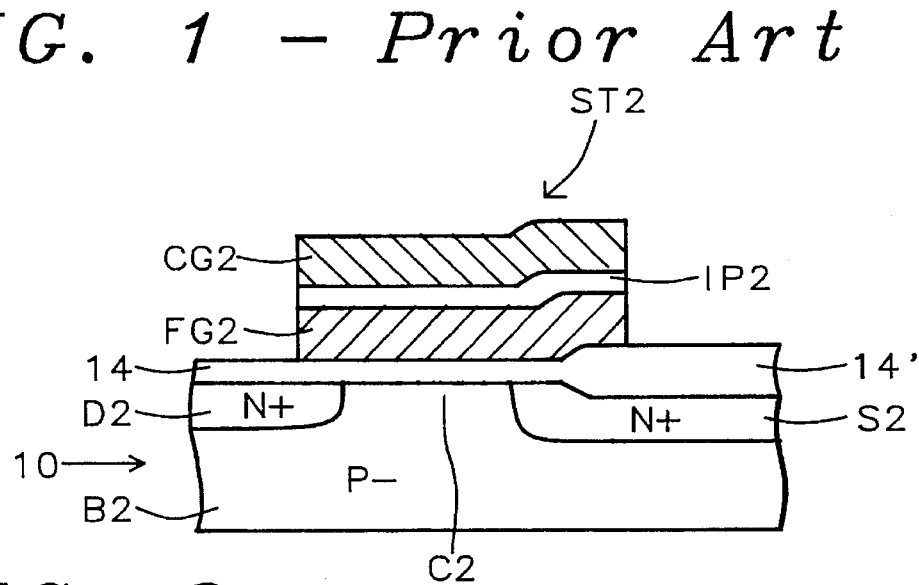
FIG. 2
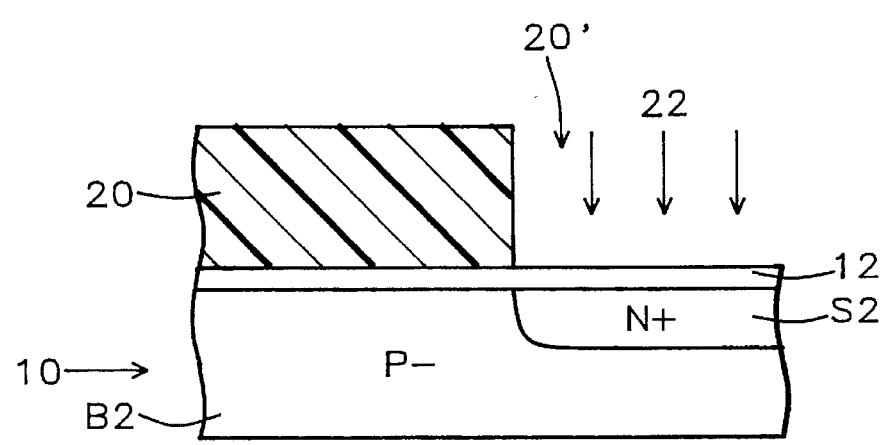
FIG. 3

METHOD OF MAKING A FLASH MEMORY CELL

BACKGROUND OF THE INVENTION

1. Field of the Invention

This invention relates to flash memory devices and more particularly to improved design of the silicon oxide dielectric layers above the source region of the devices.

2. Description of Related Art

Flash memory EEPROM (Electrically Erasable Programmable Read Only Memory) devices comprise electrically-erasable, non-volatile memory devices, which are fabricated with tunnel oxides, as well as high voltage transistors, for programming and erasing the devices.

FLOTOX (FLOating-gate Tunneling OXide) EEPROM devices are formed of an MOS transistor with a floating gate formed above a thin gate oxide (tunnel oxide) of from about 80Å–120Å thick near the drain region with a (500Å) 200Å to 500Å thick gate oxide formed elsewhere. Programming of the EEPROM is done by transferring electrons from the substrate to the floating gate electrode through the thin tunnel oxide layer by means of channel hot-electron injection. When programming an EEPROM, the control gate voltage is raised to a high level. For example the control gate voltage is raised to 12 Volts along with a drain voltage of 7 Volts so that channel hot-electron injection occurs in a FLOTOX EEPROM. In EEPROMS in general the floating gate is erased by grounding the control gate electrode and raising the source voltage to 12 Volts to cause discharge of the floating gate electrode by means of Fowler-Nordheim tunneling.

Most flash EEPROM cells have a double polysilicon structure with the upper polysilicon layer patterned to form the control gates and the word lines of the structure. The lower polysilicon layer is patterned to form the floating gates with a gate oxide having a thickness of about 100Å and an interpolysilicon dielectric comprising ONO (silicon dioxide/silicon nitride/silicon dioxide) having a thickness of from about 200Å to about 500Å.

FIG. 1 shows a sectional view of a fragment of a prior art EEPROM device 8 which includes a P– doped silicon semiconductor substrate B1 in which an N+ doped drain region D1 and an N+ doped source region S1 have been formed on opposite sides of channel region C1, which lies below a portion of a gate electrode stack ST1. The gate electrode stack ST1 comprises a first gate oxide layer GOX1, a first floating gate electrode polysilicon layer FG1, a first interpolysilicon layer IP1, and a first polysilicon control gate electrode layer CG1.

The process for formation of the structure of FIG. 1 includes the steps as follows:

1. A sacrificial silicon oxide layer is grown on the surface of a P– doped silicon semiconductor substrate to clean the edge of the field oxide (i.e. bird's beak, Kooi effect). The sacrificial silicon oxide layer is then stripped before growth of the tunnel oxide.
2. Form a blanket gate oxide layer GOX1 over P– doped silicon substrate B1.
3. Form a blanket first polysilicon (floating gate electrode) layer FG1 over gate oxide layer GOX1
4. Form a blanket interpolysilicon ONO layer IP1 over floating gate electrode layer FG1.
5. Form a blanket second polysilicon (control gate electrode) layer CG1 over interpolysilicon layer IP1.
6. Form a photoresist mask and using the mask, etch away unprotected portions of the layers therebelow above the substrate to form the flash memory gate electrode stack ST1 from blanket layers GOX1, FG1, IP1, and CG1.
7. While masking one side of the gate electrode stack, ion implant ions on the other (source region) side of the gate electrode stack ST1, into the P– doped substrate B1 to form the N+ doped source region S1 on the unmasked side of the gate electrode stack ST1.
8. Drive ions into the source region S1 to make source region S1 deep.
9. Implant ions into the substrate B1 to form a more shallow N+ doped drain region D1 on the other side of the gate electrode stack ST1 from the source region.

Problems encountered with the above process of making the device of FIG. 1 are as follows:

A. There is an extended thermal cycle that reduces the charge to breakdown $Q_{BD}$ of tunnel oxide (where $Q_{BD}$ is an indicator of how many program/erase cycles an EEPROM cell can operate without going into breakdown condition.)
B. It is not possible to tailor source and drain edges of overlap oxide thickness to meet different voltages requirements during program and erase, as follows:

Source: 12 V during erase.

Drain: 7 V during program.

SUMMARY OF THE INVENTION

A method in accordance with this invention is provided for forming a flash memory EEPROM transistor comprising the steps as follows:

1. Form a doped source region in a surface of a semiconductor substrate, one side of the channel region of the transistor,
2. Form on the surface of the semiconductor substrate a silicon oxide tunnel dielectric layer over a semiconductor substrate for the transistor.
3. When forming the tunnel dielectric layer, form a thicker gate dielectric layer over a portion of the source region because oxidation is faster on the doped source region.
4. Form a floating gate layer, an interelectrode dielectric layer, and a control gate layer over the channel region of the transistor.
5. Form at another side of the gate electrode stack opposite from the source region of the stack a doped drain region in the surface of the substrate of the doped drain region overlapping the gate structure due to lateral diffusion caused by the thermal cycle later on during manufacturing.

Preferably, the tunneling dielectric layer provides an overlap dielectric thickness between the floating gate and the source region;

The tunneling dielectric layer provides an overlap dielectric thickness between the floating gate and the drain region.

Preferably the gate oxide layer between the floating gate and the source region has a thickness between about 100Å and about 400Å; the tunneling dielectric layer has a thickness between about 60Å and about 130 <; the doped source region is formed by ion implanting with an energy from about 25 keV to about 180 keV with an N+ dopant dose from about 1E14 atoms/cm$^2$ to about 9E15 atoms/cm$^2$; and after formation of the stacked-gate structure the doped source and drain region are ion implanted with an energy from about 25 keV to about 180 keV with an N+ dopant dose from about 1E15 atoms/cm$^2$ to about 1E16 atoms/cm$^2$.

Preferably, the stacked-gate structure for the transistor is formed by deposition of blanket layers as follows: Form the floating gate layer by low pressure chemical vapor deposition of polysilicon material with a thickness from about 1,200Å to about 4,000Å. Dope the floating gate layer by a method selected from the group consisting of diffusion with $POCl_3$ or ion implanting with phosphorus dopant at an energy from about 25 keV to about 180 keV with a dose from about 2E14 atoms/cm$^2$ to about 9E15 atoms/cm$^2$. Form an interelectrode dielectric layer selected from the group consisting of silicon oxide or Oxide/Nitride/Oxide, and form the control gate layer with a thickness from about 3,500Å to about 4,700Å of a material selected from the group consisting of tungsten polycide and polysilicon formed by low pressure chemical vapor deposition of polysilicon material. Dope the control gate layer by a ion implanting with phosphorus dopant at an energy from about 25 keV to about 180 keV with a dose from about 2E14 atoms/cm$^2$ to about 9E15 atoms/cm$^2$.

In accordance with another aspect of this invention, a flash memory EEPROM transistor comprises:
1. A surface of a semiconductor substrate has a silicon oxide tunnel dielectric layer formed over a semiconductor substrate. A stacked-gate structure for the transistor comprising a floating gate layer, an interelectrode dielectric layer, and a control gate layer are formed above the tunnel dielectric.
2. A doped source region is formed on one side of the stacked gate structure in the surface of the substrate with one edge of the doped source region overlapping the gate structure.
3. A doped drain region is formed in the surface of the substrate at another side of the stacked gate structure opposite from the one side of the stacked gate structure with one edge of the doped drain region overlapping the gate structure.
4. A thicker gate oxide dielectric layer is formed over a portion of the source region.
5. Accordingly, the tunnelling dielectric layer lies beneath the stacked gate structure, over the substrate and over the drain region.

In accordance with another aspect of this invention, a flash memory EEPROM transistor comprises a semiconductor substrate; a doped source region in the surface of the substrate; a gate oxide layer formed over the surface of the substrate above the doped source region; a tunnel dielectric layer is formed on the surface of the semiconductor substrate aside from the portion of the surface over the doped source region; a stacked-gate structure for the transistor including a floating gate layer; an interelectrode dielectric layer; and a control gate layer formed over the tunnel dielectric layer and overlapping the source region; a doped drain region in the surface of the substrate at another side of the stacked gate structure opposite from the one side of the stacked gate structure with one edge of the doped drain region overlapping the gate structure; the floating gate layer comprising polysilicon material with a thickness from about 1,200Å to about 4,000Å doped with phosphorus dopant; an interelectrode dielectric layer selected from the group consisting of silicon oxide or Oxide/Nitride/Oxide; and the control gate layer with a thickness from about 3,500Å to about 4,700Å of a material selected from tungsten polycide or polysilicon ion implanted with phosphorus dopant at an energy from about 25 keV to about 180 keV with a dose from about 2E14 atoms/cm$^2$ to about 9E15 atoms/cm$^2$.

Preferably, the gate oxide layer provides an overlap dielectric thickness between the floating gate and the source region having a thickness between about 100Å and about 400Å; the tunnelling dielectric layer has a thickness between about 60Å and about 130Å; and the tunneling dielectric layer provides an overlap dielectric thickness between the floating gate and the drain region which has a thickness between about 60Å and about 130Å.

BRIEF DESCRIPTION OF THE DRAWINGS

The foregoing and other aspects and advantages of this invention are explained and described below with reference to the accompanying drawings, in which:

FIG. 1 shows a sectional view of a fragment of a prior art EEPROM device which includes a silicon semiconductor substrate in which a doped drain region and a doped source region have been formed on opposite sides of a channel region, which lies below a portion of a gate electrode stack.

FIG. 2 shows a sectional view of a fragment of a flash memory device in accordance with this invention which includes a doped portion of a silicon semiconductor substrate in which a doped drain region and an N+ doped source region have been formed on opposite sides of channel region which lies below a portion of a gate electrode stack with a tunnel oxide layer below the gate electrode stack and a substantially thicker gate oxide layer over the source region.

FIGS. 3–10 are sectional views of a fragment of the device 10 of FIG. 2 illustrating the sequence of steps in the process of fabrication of the device 10 in accordance with the method of this invention.

DESCRIPTION OF THE PREFERRED EMBODIMENT

Figure 4:
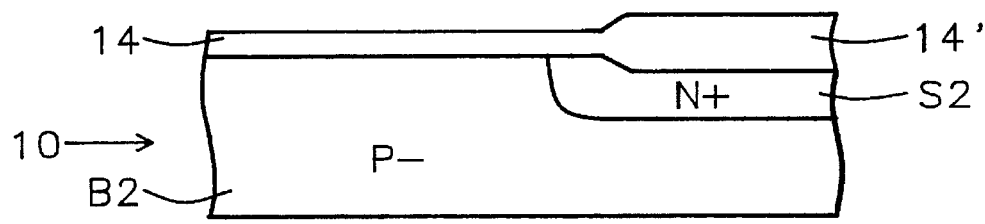

FIG. 2 shows a sectional view of a fragment of a flash memory device 10 in accordance with this invention which includes a P– doped portion of a silicon semiconductor substrate B2 in which an N+ doped drain region D2 and an N+ doped source region $2 have been formed on opposite sides of channel region C2, which lies below a portion of a gate electrode stack ST2 with a tunnel oxide layer 14 below the gate electrode stack ST2. A gate oxide layer 14' formed over the source region is substantially thicker than the tunnel oxide layer 14. The gate electrode stack ST2 includes the tunnel oxide layer 14 as well (as an overlapping portion of the thicker gate oxide layer 14'), a floating gate electrode layer FG2, an interpolysilicon layer IP2, and a control gate electrode layer CG2.

On the right side of the channel region in substrate B2 a source region S2 is formed, which is heavily implanted with N-type arsenic or phosphorus dopant with a dose from about 2E14 atoms/cm$^2$ to about 9E15 atoms/cm$^2$.

Optionally, at an early point in the manufacturing process, prior to forming tunnel oxide layer 14, a thermal cycle for forming the source region S2 is performed. Thus, since the thermal cycle is performed before the tunnel oxide layer 14 has been formed, damage to the device 10 from performing a thermal cycle later in the process is avoided by performing the step early in the manufacture of device 10.

A thin tunnel oxide (silicon oxide) layer 14 which has a thickness from about 60Å to about 130Å is grown on substrate B2, and at the same time, a thicker gate oxide (silicon oxide) layer 14' is grown over the source region S2 due to dopants caused by the heavy implant process employed during the earlier step of doping the source region S2.

Over a portions of the tunnel oxide layer 14 and the thicker gate oxide layer 14' is formed a gate electrode stack ST2 comprising a floating gate electrode polysilicon layer FG2, an interpolysilicon layer IP2, and a polysilicon control gate electrode layer CG2.

The advantages of the design shown in FIG. 2 over the design shown in FIG. 1 are as follows:
1. Where the floating gate electrode FG2 and source region S2 overlap each other, the oxide thickness of tunnel oxide layer 14 and thicker gate oxide layer 14' is between about 100Å and about 400Å can be tailored thicker to be suitable for use with a source voltage of 12 V.
2. Where the floating gate electrode FG2 and drain region D2 overlap each other, the oxide thickness of layer 14 is between about 60Å and about 130Å can be tailored just for the drain region to improve hot-electron injection efficiency.
3. There is reduced thermal stress placed on the tunnel oxide.

Process for Formation of Improved Flash Memory

FIGS. 3–10 are sectional views of a fragment of the device 10 of FIG. 2 illustrating the sequence of steps in the process of fabrication of the device 10 in accordance with the method of this invention.

In FIG. 3 the device 10 of FIG. 2 is shown in an early stage of fabrication. On a P– doped silicon semiconductor substrate B2, a blanket sacrificial silicon dioxide layer 12 has been formed. In a later stage of the process, above sacrificial silicon dioxide layer 12 a source implant photoresist mask 20 has been formed with an source region opening 20' which has been formed over the sacrificial silicon dioxide layer 12. Mask 20 covers and protects the portion of substrate B2 where the drain region D2 and channel region C2 are to be formed. The source region opening 20' leaves the location of source region S2 exposed for ion implantation with a step of N+ doping with arsenic or phosphorus ions 22 to form the N+ doped source region S2. Region S2 is ion implanted with an energy from about 25 keV to about 180 keV with an N+ dopant dose from about 1E14 atoms/cm$^2$ to about 9E15 atoms/cm$^2$.

FIG. 4 shows the device 10 of FIG. 3 after the source implant mask 20 has been stripped away using a conventional process of stripping photoresist.

Next, the sacrificial silicon dioxide layer 12 stripped away exposing the surface of source region S2 and the surface of substrate B2.

Next, the device 10 has been covered with a tunnel (silicon oxide) layer 14 over substrate B2 and a gate oxide layer 14' over source region S2. The tunnel oxide layer 14 has a thickness from about 60Å to about 130Å. Due to the heavy N+ dopant within the source region S2, the gate oxide layer 14' is grown above the source region (which is thicker than the tunnel oxide layer 14) having a thickness within the range from about 100Å to about 400Å.

Figure 5:
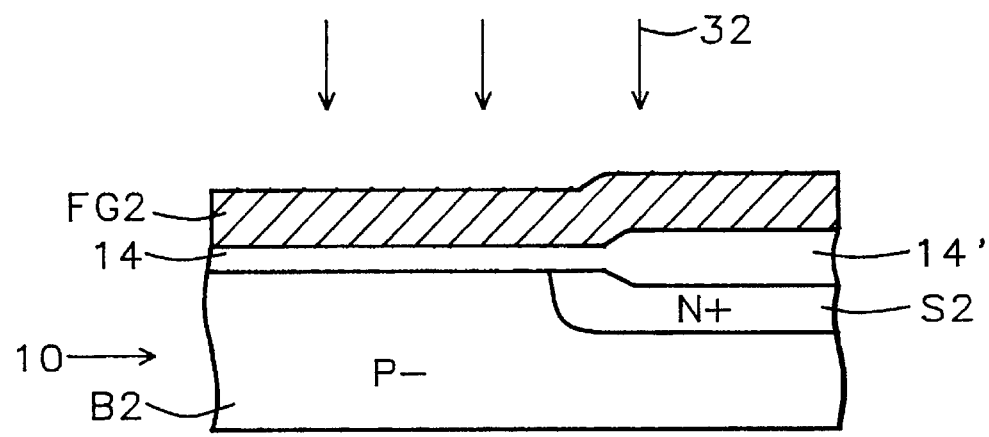

FIG. 5 shows the device 10 of FIG. 4 after the blanket tunnel oxide layer 14 and the gate oxide layer 14' have been coated with the floating gate electrode polysilicon layer FG2 formed by the process of LPCVD (Low Pressure Chemical Vapor Deposition) with a thickness from about 1,200Å to about 4,000Å doped by ion implanting with phosphorus dopant 32 at an energy from about 25 keV to about 180 keV with a dose from about 2E14 atoms/cm$^2$ to about 9E15 atoms/cm$^2$.

Alternatively, the doping of gate electrode layer FG2 can be achieved by a chemical diffusion treatment with a phosphorus liquid source such as phosphorus oxychloride (POC13) at a temperature from about 850° C. to about 950° C.

Figure 6:
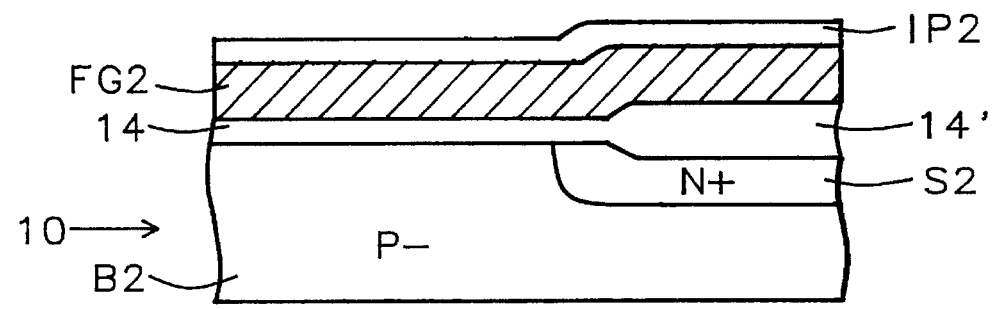

FIG. 6 shows the device 10 of FIG. 5 after a blanket interpolysilicon dielectric layer IP2 has been formed over the floating gate electrode polysilicon layer FG2. The interpolysilicon dielectric layer IP2 can be composed of either silicon oxide or ONO (Oxide/Nitride/Oxide).

Figure 7:
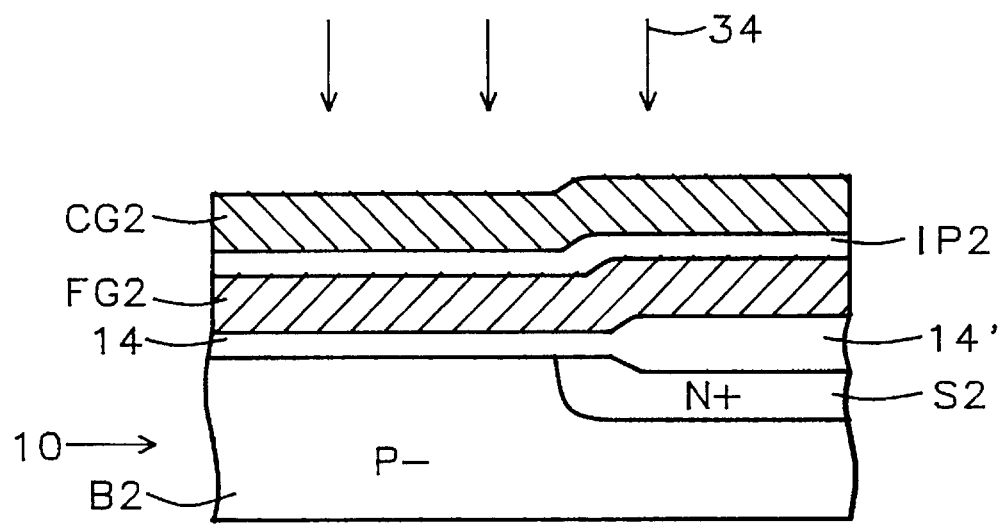

FIG. 7 shows the device 10 of FIG. 6 after the blanket interpolysilicon layer IP2 has been coated with a control gate electrode layer CG2 formed of polysilicon or tungsten polycide by the process of LPCVD with a thickness from about 3,500Å to about 4,700Å doped by ion implanting with phosphorus dopant 34 at an energy from about 25 keV to about 180 keV with a dose from about 2E14 atoms/cm$^2$ to about 9E15 atoms/cm$^7$.

Figure 8:
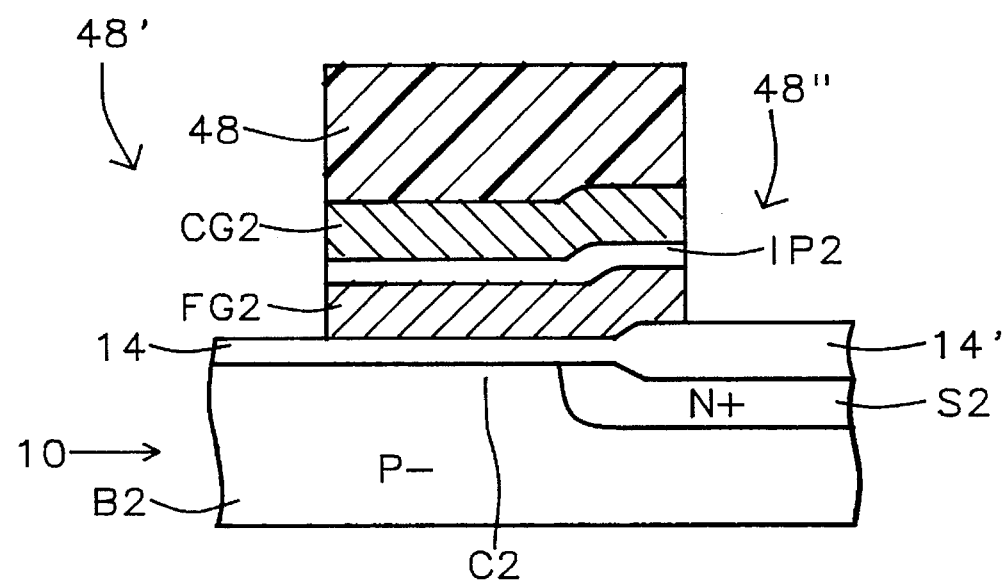

FIG. 8 shows the device 10 of FIG. 7 with a gate electrode stack photoresist mask 48 formed above the control gate layer CG2 with an opening 48' therethrough on the side of the drain region D2 and with an opening 48" therethrough on the side of the source region S2. The stack ST2 has been etched to form the stack ST2 from the tunnel oxide layer 14, the floating gate electrode polysilicon layer FG2, the interpolysilicon layer IP2, and the polysilicon control gate electrode layer CG2. The drain region D2 and source region S2 of FIG. 2 have both been exposed.

Figure 9:
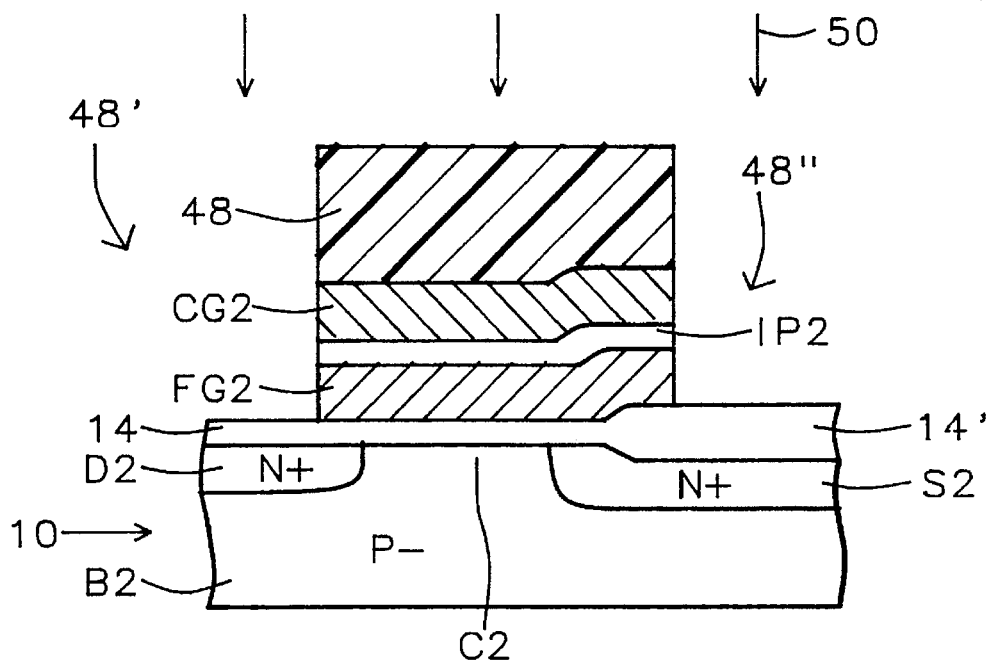

FIG. 9 shows device 10 of FIG. 8 with arsenic N+ ions 50 being implanted through opening 48' into drain region D2 and through opening 48" into source region S2 with an energy from about 25 keV to about 180 keV with a dose from about 1E15 atoms/cm$^2$ to about 1E16 atoms/cm$^2$.

Figure 10:
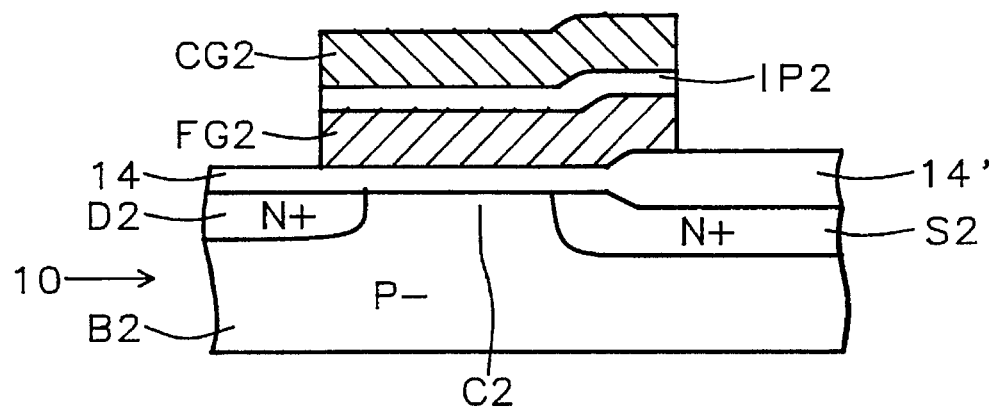

Referring to FIG. 10, after the step of FIG. 9, the photoresist mask 48 is stripped away by conventional means yielding the product shown in FIG. 10 which is the product shown in FIG. 2.

SUMMARY

The process of FIGS. 3–10 includes the steps as follows:
1. Form a blanket layer of silicon oxide 12 over P– doped silicon substrate B2.
2. Implant ions 22 into the substrate B1 to form an N+ doped source region which will be on a source region side of the gate electrode stack ST2 as seen in FIG. 2.
3. Form a blanket tunnel oxide layer 14/gate oxide layer 14' over the substrate B2 and the source region S2.
4. Form a heavily doped first polysilicon (floating gate electrode) blanket layer FG2 over gate oxide layer 14.
5. Form silicon oxide or ONO blanket layer IP2 over layer FG2.
6. Form a heavily doped second polysilicon or polycide (control gate electrode) blanket layer CG2.
7. Form a stack mask 48 for stack ST2 and then etch to form the flash memory gate electrode stack ST2 from blanket layers 14, FG2, IP2, and CG2.
8. Implant ions into the substrate bulk B2 to form a more shallow N+ doped drain region D2 on the other side of the gate electrode stack ST2 from the source region.
9. Strip the stack mask 48 from the device.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a flash memory EEPROM transistor comprising the steps in the sequence as follows:

forming on a surface of a semiconductor substrate a sacrificial silicon oxide layer over a semiconductor substrate, forming a doped source region in the surface of said substrate, stripping said sacrificial silicon oxide layer from said semiconductor substrate, forming a dielectric layer over said substrate including a gate oxide layer over said source region and a tunnelling dielectric layer over said substrate aside from said source region, forming a stacked-gate structure for said transistor said stacked-gate structure overlapping one edge of said doped source region, said stacked-gate structure comprising a floating gate layer, an interelectrode dielectric layer, and a control gate layer, and forming at another side of said stacked gate structure opposite from said one side of said stacked gate structure a doped drain region in the surface of said substrate with one edge of said doped drain region overlapping said gate structure.

2. A method in accordance with claim 1 wherein said gate oxide layer between said floating gate and said source region has a thickness between about 100Å and about 400Å.

3. A method in accordance with claim 1 wherein the said tunneling dielectric layer has a thickness between about 60Å and about 130Å.

4. A method in accordance with claim 2 wherein the said tunneling dielectric layer has a thickness between about 60Å and about 130Å.

5. A method in accordance with claim 1 wherein said doped source region is formed by ion implanting with an energy from about 25 keV to about 180 keV with an N+ dopant concentration from about 1E14 atoms/cm² to about 9E15 atoms/cm².

6. A method in accordance with claim 1 wherein after formation of said stacked-gate structure said doped source and drain region are ion implanted with an energy from about 25 keV to about 180 keV with an N+ dopant dose from about 1E15 atoms/cm² to about 1E16 atoms/cm².

7. A method in accordance with claim 5 wherein after formation of said stacked-gate structure said doped source and drain region are ion implanted with an energy from about 25 keV to about 180 keV with an N+ dopant dose from about 1E15 atoms/cm² to about 1E16 atoms/cm².

8. A method in accordance with claim 1 wherein said tunneling dielectric layer comprises a tunnel oxide layer providing an overlap dielectric thickness between said floating gate and said drain region which has a thickness between about 60Å and about 130Å.

9. A method in accordance with claim 1 wherein said stacked-gate structure for said transistor is formed by deposition of blanket layers as follows:

forming said floating gate layer by low pressure chemical vapor deposition of polysilicon material with a thickness from about 1,200Å to about 4,000Å, doping said floating gate layer by a method selected from the group consisting of diffusion with $POCl_3$ and ion implanting with phosphorus dopant at an energy from about 25 keV to about 180 keV with a dose from about 2E14 atoms/cm² to about 9E15 atoms/cm², forming an interelectrode dielectric layer selected from the group consisting of silicon oxide or Oxide/Nitride/Oxide, and forming said control gate layer with a thickness from about 3,500Å to about 4,700Å of a material selected from the group consisting of tungsten polycide and polysilicon formed by low pressure chemical vapor deposition of polysilicon material and doping said control gate layer by a ion implanting with phosphorus dopant at an energy from about 25 keV to about 180 keV with a dose from about 2E14 atoms/cm² to about 9E15 atoms/cm².

10. A method in accordance with claim 9 wherein said gate oxide layer between said floating gate and said source region has a thickness between about 100Å and about 400Å.

11. A method in accordance with claim 9 wherein the said tunneling dielectric layer has a thickness between about 60Å and about 130Å.

12. A method in accordance with claim 10 wherein the said tunneling dielectric layer has a thickness between about 60Å and about 130Å.

13. A method in accordance with claim 9 wherein said doped source region is formed by ion implanting with an energy from about 25 keV to about 180 keV with an N+ dopant dose from about 1E14 atoms/cm² to about 9E15 atoms/cm².

14. A method in accordance with claim 9 wherein after formation of said stacked-gate structure said doped source and drain region are ion implanted with an energy from about 25 keV to about 180 keV with an N+ dopant dose from about 1E15 atoms/cm² to about 1E16 atoms/cm².

15. A method in accordance with claim 13 wherein after formation of said stacked-gate structure said doped source and drain region are ion implanted with an energy from about 25 keV to about 180 keV with an N+ dopant dose from about 1E15 atoms/cm² to about 1E16 atoms/cm².

16. A method in accordance with claim 9 wherein said tunneling dielectric layer comprises a tunnel oxide layer providing an overlap dielectric thickness between said floating gate and said drain region which has a thickness between about 60Å and about 130Å.

* * * * *